(12) United States Patent
Napoletano et al.

(10) Patent No.: US 9,128,135 B1
(45) Date of Patent: Sep. 8, 2015

(54) SYSTEM, METHOD, AND COMPUTER PROGRAM PRODUCT TO PROVIDE WIRELESS SENSING BASED ON AN AGGREGATE ELECTRIC FIELD READING

(71) Applicant: Lockheed Martin Corporation, Bethesda, MD (US)

(72) Inventors: Nathaniel Napoletano, Akron, OH (US); Robert Dale Peters, Nova, OH (US)

(73) Assignee: LOCKHEED MARTIN CORPORATION, Bethesda, MD (US)

( * ) Notice: Subject to any disclaimer, the term of this patent is extended or adjusted under 35 U.S.C. 154(b) by 255 days.

(21) Appl. No.: 13/732,975

(22) Filed: Jan. 2, 2013

(51) Int. Cl.
G06N 3/08 (2006.01)
G01R 27/26 (2006.01)
G06N 3/02 (2006.01)

(52) U.S. Cl.
CPC .............. G01R 27/2605 (2013.01); G06N 3/02 (2013.01)

(58) Field of Classification Search
None
See application file for complete search history.

(56) References Cited

U.S. PATENT DOCUMENTS

| 6,271,830 B1 | 8/2001 | Berstis |
| 6,480,183 B1 | 11/2002 | Van Ruymbeke et al. |
| 7,621,441 B1 * | 11/2009 | Milford et al. ............... 235/375 |

FOREIGN PATENT DOCUMENTS

WO 98/05974 2/1998

OTHER PUBLICATIONS

Ketabdar, et al., Towards Using Embedded Magnetic Field Sensor for Around Mobile Device 3D Interaction, MobileHCI, 2010, pp. 1-5.*

* cited by examiner

*Primary Examiner* — Wilbert L Starks
(74) *Attorney, Agent, or Firm* — Terry M. Sanks, Esq.; Beusse Wolter Sanks & Maire, PLLC

(57) ABSTRACT

A system including a plurality of actuation devices with each actuation device configured to have a metalized and charged to an electrical potential rear part which moves to a designated position representative of a designated manipulation, when at least one actuation device is manipulated, a capacitive sensor array configured to measure a composite electric field produced by the plurality of actuation devices, an acquisition device configured to acquire electric field data indicative of the measured electric field, a converter configured to convert the acquired electric field data into analog values, and a processor configured to evaluate to the analog values to determine which of the at least one actuation devices was manipulated, how the manipulation reflects operation of the control panel, or to provide a response indicative of the manipulation. A method and a computer program product are also disclosed.

19 Claims, 3 Drawing Sheets

SYSTEM, METHOD, AND COMPUTER PROGRAM PRODUCT TO PROVIDE WIRELESS SENSING BASED ON AN AGGREGATE ELECTRIC FIELD READING

BACKGROUND

Embodiments relate generally to optical identification and, more particularly, to a system, method, and computer program product to provide wireless sensing using electric field measurements.

Training and/or simulation systems are used to assist in training users to operate a variety of complex electro-mechanical systems. For example, flight training is a field where training and/or simulation systems are used to assist in training pilots to operate aircraft. Training and/or simulation systems are also being used in a variety of other vast fields, including, but not limited to, operating of vehicular and/or marine systems, medical training, military combat training, etc.

Currently, many training and/or simulation systems are built utilizing equivalent electronic and mechanical components which are a part of the actual system that the training and/or simulation system is built to emulate. Under this approach as actual systems become more complex, so have the associated training and/or simulation systems. Additionally, to further create a more realistic environment of what a user experiences when using an actual system, very high fidelity trainers are being developed to further enhance the training and/or simulation systems. With such systems not only will the user be able to train by operating controls in learning with an immersive environment, but the user will also be able to visually see the effect of her/his decisions made.

By using the same, or similar, electronics as operational systems, current training and/or simulation systems also require similar wiring of components as the actual operational systems. Because of this requirement, the training and/or simulation systems are complex systems which prohibit them from being mobile and flexible enough to be readily disassembled and reassembled in a shortened period, such as within a few hours instead of days for transportation to the point-of-need. Furthermore, because of the current approach of having fully wired training and/or simulation systems, the cost for such systems is increasing as capabilities of actual systems are also increasing.

Thus, users and manufactures of training and/or simulation systems, including immersive human systems, would realize financial and operability benefit from having a technology which reduces expenses and improves an ability to build, assemble, and/or disassemble such systems by utilization of a wireless sensing technology to replace a use of wires or wiring harnesses between user actuated controls and corresponding subsystems.

BRIEF DESCRIPTION

Embodiments relate to a system, method, and computer software code to provide wireless communication based on detection of an electric field generated from an aggregate of devices or components. The system comprises a plurality of actuation devices with each actuation device configured to have a metalized and charged to an electrical potential rear part which moves to a designated position representative of a designated manipulation, when at least one actuation device is manipulated, and a capacitive sensor array configured to measure a composite electric field produced by the plurality of actuation devices. The system also comprises an acquisition device configured to acquire electric field data indicative of the measured electric field, and a converter configured to convert the acquired electric field data into analog values. The system also comprises a processor configured to evaluate to the analog values to determine which of the at least one actuation devices was manipulated, how the manipulation reflects operation of the control panel, or to provide a response indicative of the manipulation.

The method comprises providing at least one actuation device of a plurality of actuation devices on a control panel, the at least one actuation device is capable of being manipulated at a front end which moves a back end which is metalized and charged to an electrical potential to create an electric field. The method also comprises actuating the at least one actuation device of the plurality of actuation devices in response to manipulation which causes the back end to move to a designated position indicative of a designated manipulation of the at least one actuation device. The method also comprises measuring a composite electric field created by the plurality of actuation devices, acquiring electric field data based on the composite electric field measured, and converting the electric field data to analog values representative of positions of each actuation device of the plurality of actuation devices. The method also comprises determining with a learning network and based on the analog values, which of the at least one actuation device was manipulated, how the manipulation reflects operation of the control panel, or to provide a response indicative of the manipulation.

The computer software code is on a non-transitory processor readable storage medium, that, when executed on a processor, causes the processor to detect, by activating a detection device, an electric field created by a plurality of actuation devices on a control panel, each actuation device is capable of being manipulated at a front end which moves a back end of the control panel, and which is metalized and charged to an electrical potential to create an electric field, from a first position to at least one other position. The processor is also caused to acquire, by activating an acquisition device, electric field data representative of the composite electric field created by the plurality of actuation devices, and convert the electric field data to analog values. The processor is also caused to determine, with a learning network and based on the analog values, which of the at least one activation device was manipulated, how the manipulation reflects operation of the control panel, or to provide a response indicative of the manipulation.

BRIEF DESCRIPTION OF THE DRAWINGS

A more particular description briefly stated above will be rendered by reference to specific embodiments thereof that are illustrated in the appended drawings. Understanding that these drawings depict only typical embodiments and are not therefore to be considered to be limiting of its scope, the embodiments will be described and explained with additional specificity and detail through the use of the accompanying drawings in which.

DETAILED DESCRIPTION

Figure 1:
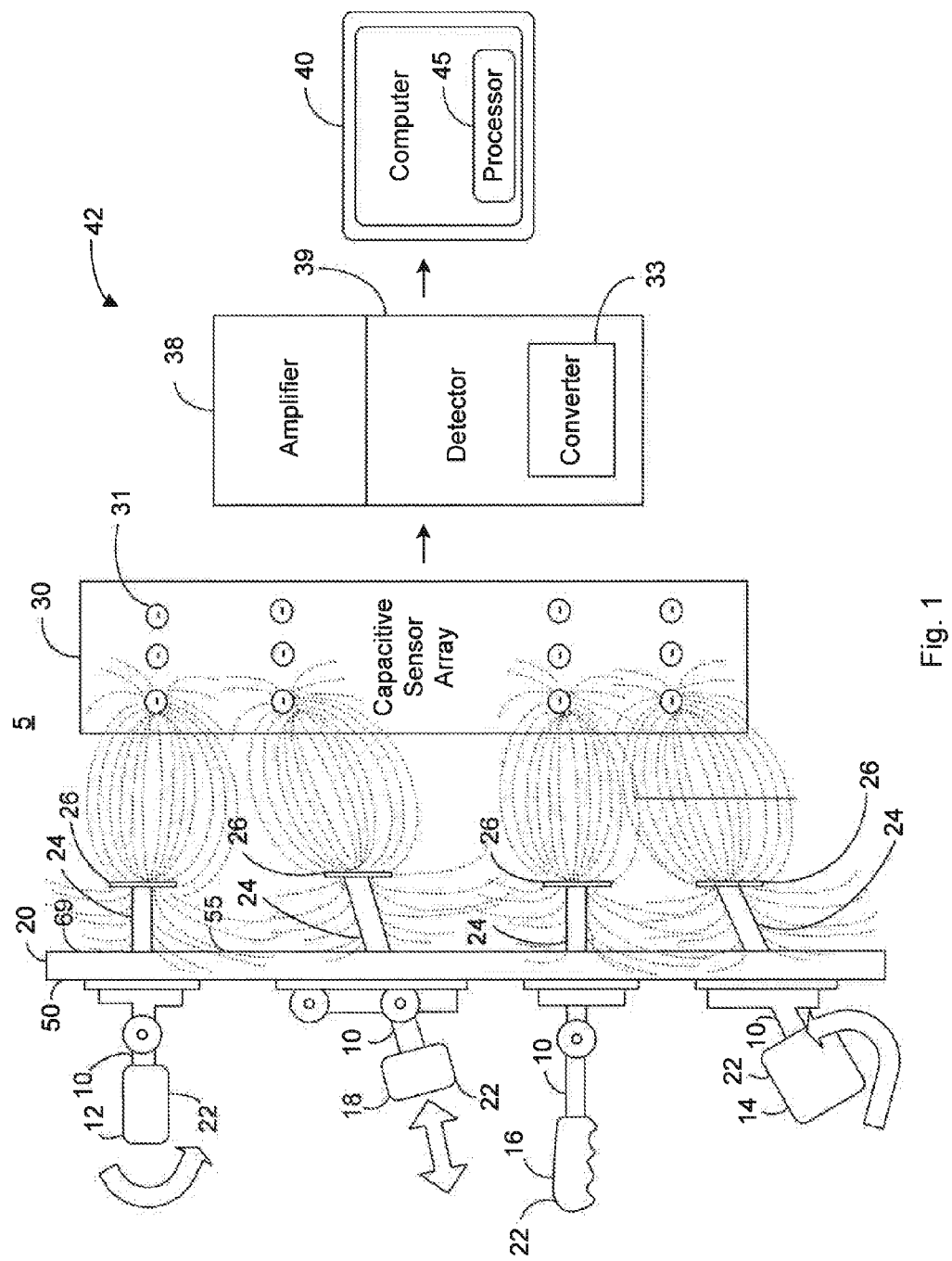
FIG. 1 shows an embodiment of a system providing wireless sensing based on aggregate electric field detection.

Reference will be made below in detail to embodiments which are illustrated in the accompanying drawings. Wherever possible, the same reference numerals used throughout the drawings refer to the same or like parts. Broadly speaking, a technical effect is to provide wireless sensing (a form of communicating), using electric field detection, where electric field changes realized from a complete set of instruments or actuation devices are evaluated to determine which of the instruments have been actuated or manipulated. To facilitate an understanding of embodiments, reference to specific implementations thereof is provided herein.

Though embodiments are disclosed herein with reference to the training and/or simulation systems (including immersive human systems), the embodiments are applicable with other devices or systems. As a non-limiting example, the embodiments may be utilized with other systems, such as, but not limited to, arcade or other gaming systems. Thus the descriptions regarding the embodiments provided herein which specifically discuss being used with training and/or simulation systems shall not be considered limiting. Furthermore, though the term "control panel" is used, this term is not intended to be limiting since actuation devices disclosed herein may be housed by any sort of housing device. Thus the term control panel is applicable to any sort of device used to house or hold any actuation device.

Referring now to the drawings, embodiments will be described. Embodiments can be implemented in numerous ways, including as a system (including a computer processing system), a method (including a computerized method), an apparatus, and/or with a non-transitory processor readable storage medium. Several embodiments are discussed below.

FIG. 1 shows an embodiment of a system 5 for providing wireless communication (or sensing) based on aggregate electric field detection. The system may include a plurality of different actuation devices 10. Such actuation devices 10 may comprise, but are not limited to, a switch 12, rotating (or rotary) knob 14, lever 16 and/or push button 18. In an embodiment, the plurality of actuation devices 10 may control one or more functions of a simulated vehicle, truck, aircraft, or device. Each actuation device 10, when manipulated, such as but not limited to, by a user, results in motion in a rear, or back side, of a control panel 20 that corresponds to actuation of the particular actuation device 10 at a front side of the control panel 20. More specifically, each actuation device 10 has a first end 22 (sometimes hereinafter referred to as "front end 22") or side which may be manipulated and a second end 24 (sometimes hereinafter referred to as "back end 24") or side which moves in accordance with the manipulation of the first end 22. The front end 22 of the actuation device 10 may be accessible and/or viewable by the user so that the user may manipulate it, whereas the back end 24 may not be viewable and/or accessible by the user. The type of movement realized may be of any sort, such as, but not limited to, front to back, side to side, circular, etc. A type of manipulation is non-limiting. As several non-limiting examples, manipulation may be caused by a user pulling the lever 16, rotating the knob 14, pushing the button 18, etc., and/or by automatic manipulation based caused by a processor 45 or computer 40 (such as a simulation host computer) in response to or as part of a simulated mission or training exercise. Though the computer 40 and processor 45 are illustrated as the processor 45 being a part of the computer 40, the processor 45 may be independent of the computer 40.

In an embodiment, the actuation devices 10 may be faux or dumb actuation devices, requiring no electrical wiring or electrical contact components. The faux or dumb actuation devices 10 may be moved in a manner similar or identical to real actuation devices. However, the faux or dumb actuation devices 10, when actuated, may not provide an electrical signal, stimulus, or make an electrical connection or contact as the real actuation devices would provide. Thus, the use of electric fields as taught herein is outside the scope of the electrical connection or contact that the real actuation devices use to interact with and/or which may control one or more functions of an actual vehicle, truck, aircraft, or device. For clarification purposes only, the electrical signal, stimulus or other electrical connection used with real actuation devices are referred to as wired electrical signal herein. The term "wired" however is not meant to be limiting, but to distinguish the system 5 disclosed herein from how real actuation devices function.

In an embodiment, the system 5 may employ actuation devices 10 which may employ contactless switching. The system 5 may be configured to sense one, a set or an array of switch states of one, a set or an array of faux or dumb actuation devices.

The second end 24 of the actuation device 10 may be metalized and charged to an electrical potential. As used herein, the electrical or electric potential is at a point the amount of electric potential energy that a unitary point charge has that location would have. The electric potential at a point is equal to the electric potential energy (measured in joules) of any charged particle at that location divided by a charge (measured in coulombs) of the particle. Since the charge has been divided out, the electric potential is a "property" related only to the electric field itself and not the charge of the particle. As a non-limiting example, the second end 24 which is metalized and charged may be a charged plate 26, such as but not limited to, an electrically charged plate is attached to the second end 24 of the actuation device 10. Thus, the charged plate 26 may be attached to the moving part of the actuation device 10, such as, but not limited, at the second end 24. Though such terms as "charged plate" and "electrically charged plate" are used herein, these terms should be considered as having a part of the actuation device producing an electric field. More specifically, they should be considered as providing a part of the actuation device 10 which is metalized and charged to an electrical potential. Furthermore, even though the charged plate 26 is disclosed as being attached to the actuation device 10, the charged plate 26 may be an integrated part of the actuation device 10. Thus, the use or description of being attached shall be construed broad enough to cover the charged plate being an integral part of the actuation device 10 or that the actuation device 10 has a metalized and grounded part.

As the moving part of the actuation device 10 is moved due to manipulation of the actuation device 10, such as but not limited to, by a user, the projection of the electric field generated by the actuation device 10 may be changed responsive to the manipulation. As a non-limiting example, if a switch 12 or lever 16 is the actuation device 10, when the switch 12 or lever 16 is moved to a certain position, the charged plate 26 may be positioned, at a specific position wherein the position may be repeated each time the switch 12 or lever 16 is placed in the same similar position in subsequent manipulations. More specifically, based on a designated manipulation, the charged plate 26 may be moved to a designated position which is indicative of the designated manipulation.

The electric fields of all of the charged plates 26 attached to respective actuation devices 10 combine to create a composite three-dimensional electric signature (aggregate electric field or composite electric field) that represents a state of all actuation devices 10, or in general the control panel 20. A capacitive sensor array 30 is provided. The array 30 may comprise a plurality of two-dimensional capacitive sensor arrays 30. The array 30 may be placed on a back side of the control panel 20 so that the array 30 cuts a plane through the three-dimensional composite electric field of the charged plates 26 attached to the actuation devices 10. The individual capacitors 32 of the array 30 are read periodically so that changes in any actuation devices 10, namely, manipulations, are detected as scalar variations in one or more individual capacitor readings. More specifically, manipulation of an actuation device 10 causes a change in dielectric separation and/or an effective electrode area between the charged plates, which is a metalized surface and charged to their electrical potential, and the capacitive sensor array 30. The capacitors 32 may be read at least as frequently as every ten (10) milliseconds (ms), but may be read more frequently (up to being read continuously).

Though disclosed as being on the back side of the control panel, the array 30 may be placed at another location proximate to the actuation devices 10 and their respective charged plates 26 so that the aggregate electric field is accessible. Also, though one charged plate is disclosed as being attached a respective actuation device, more than one charged plate may be attached to each actuation device. In such an arrangement, a single charged plate may be attached to more than one actuation device so that when movement, or a position change, of the one charged plate occurs, the new position may signify which actuation device has been manipulated. Thus, the disclosure of a one-to-one relationship between a charged plate and activation switch is not meant to be limiting.

An amplifier 38, such as, but not limited to, an instrumentation amplifier may be provided to amplify the composite electric field collected by the capacitors 32. In another embodiment, the amplifier 38 amplifies the composite electric field prior to the capacitors 32 collecting the composite electric field data. A detector 39 may also be provided to measure and/or acquire electric field data produced by the entire control panel. The amplifier 38 and detector 39 may be part of a signal component 42. The detector 39 may convert the sampled electric field data into analog values. This may be accomplished every 10 ms or faster. In an embodiment, a converter 33 is provided to convert the data into analog values. Though the term "analog values" is used in its plurality, analog values may only include a single analog value. Therefore the use of analog values also comprises a singular analog value.

In an embodiment, the ability to convert the sampled electric field data to analog values is performed by a computer 40, more specifically at least one processor 45. Thus, the processor 45 is considered to comprise the convertor part of the detector 39 or any system or computer program which may convert the electric field data to the analog values. The analog values are evaluated, within the processor 45, to determine which one (or ones) of the actuation device 10 is manipulated based on measurements from the composite electric field. The analog values may also be used to determine how the manipulation (more specifically which one (or ones) of the actuation device manipulated) reflects operation of the control panel, and hence the training and/or simulation system. The analog values may also be used to provide a response indicative of the manipulation, such as notifying the user of information (such as, but not limited to, through a display or audible notifier) and/or communicating to the simulation host computer 40 which is integral to the training and/or simulation system. As explained above, the processor may be separate from the computer 40. Furthermore, the computer 40 which operates with the processor 45 may be distinct and separate from the simulation host computer 40. Therefore, the representation of computer 40 is not meant to be considering limiting with respect to signifying a single computer since a plurality of computers 40 may exist, each with independent or redundant functions.

The processor 45 may utilize a probabilistic model to analyze the analog values to determine which one (or ones) actuation device may be (or may be was) manipulated, how the manipulation reflects operation of the control panel 20, and/or to provide a response indicative of the manipulation. A non-limiting example of use of a probabilistic model may be a learning network 43, and by way of a non-limiting example, a trainable Bayesian network to analyze the analog values to determine which one (or ones) actuation device of the plurality of actuation devices may be, or may have been, manipulated, how the manipulation reflects operation of the control panel, and/or to provide a response indicative of the manipulation. Another non-limiting example is a classifier neural network, namely a neural network which is used to infer a function from observations and able to use it. For simplification purposes only, learning network 43 may be used to represent the probabilistic model, the Bayesian network, and/or the classifier neural network.

The Bayesian network is a mathematical model that encodes probabilistic relationships among variables of interest. When used in conjunction with statistical techniques, the mathematical model has several advantages for data analysis since it can be used to predict and then learn. For example, once the model encodes dependencies among all variables, more specifically a plurality of electric fields taken from a plurality of electric field readings where different actuation devices 10 are manipulated, it may be capable of readily handling situations where some data entries are missing. Thus, the processor 45 may be able to determine a particular actuation device's setting when an electric field data reading is not determinative based on prior obtained readings, but where the electric field data readings are based on their respective analog values assigned. This can happen when ambient electro-magnetic noise infiltrates the system.

The Bayesian network may also be used to learn causal relationships, and hence can be used to gain understanding about operation of the training and/or simulation system and predict consequences of manipulation of at least one of the actuation devices. The Bayesian network may comprise both a causal semantic and a probabilistic semantic. Thus, it may be used to combine prior knowledge (former analog values) and current analog values to determine effects of manipulation of any one of the plurality of actuation devices, which in essence results in a learning network 43. Bayesian statistical methods may be used in conjunction with the Bayesian network to provide for an efficient and principled approach for learning how a manipulation affects the training and/or simulation system. Bayesian statistical topologies may also be hybridized with classifier neural network topologies creating a system that more accurately interprets the electric data.

Figure 2:
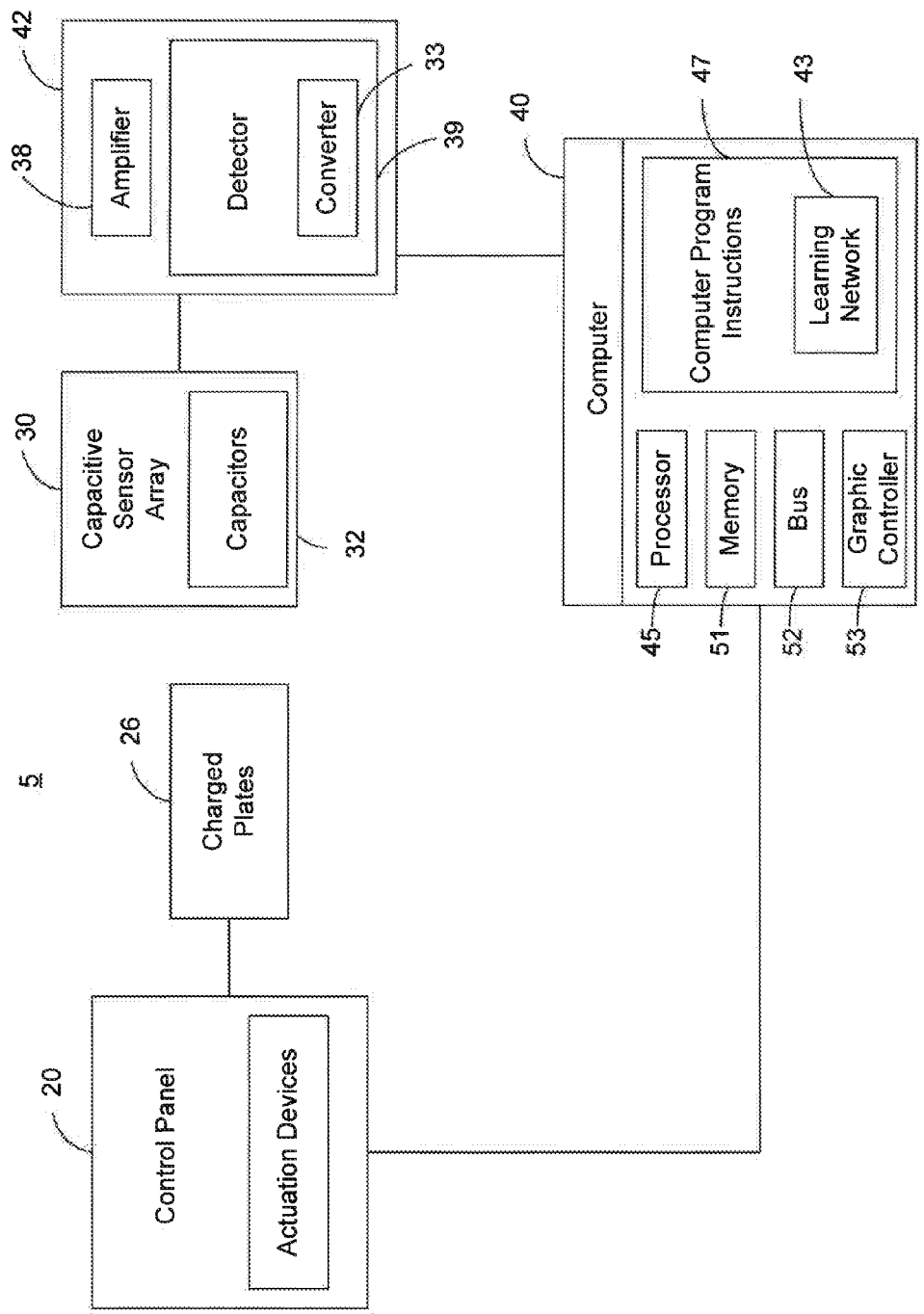
FIG. 2 shows a block diagram illustrating the system of an embodiment.

FIG. 2 shows a block diagram illustrating the system 5 or an embodiment. As discussed above, the plurality of actuation devices 10 is provided. The control panel 20 may house the plurality of actuation devices 10. Each of the plurality of actuation devices 10 may be manipulatable from a front side 50 (illustrated in FIG. 1) of the control panel 20. Charged plates 26 may be located on a back side 69 of the control panel 20 or parts of the back side 69 (illustrated in FIG. 1) may be metalized and charged to an electrical potential. Each respective charged plate 26 may be configured to be in communication with at least one respective actuation device 10 so that the respective charged plate 26 may move from a first position to at least one other position when the at least one actuation device 10 is manipulated. As explained above, the charged plate 26 may be moved to a designated position which is indicative of a designated manipulation of the actuation device 10. This movement of the respective charged plate 26 causes a change in the composite electric field generated by the control panel 20 or the plurality of charged plates 26. The capacitive sensor array 30 is disclosed to be within close enough proximity to the control panel 20 to cut a two-dimensional plane through the composite three-dimensional electric field. The instrument amplification device 38 is also disclosed which may be used to amplify and convert electric field data to analog values.

The computer 40 may be disclosed as having at least one processor which receives the analog values. The processor 45 may be used to process the learning network 43. Based on the analog values, the computer 40 and/or the processor 45 may be connected to the control panel 20 to communicate, such as to the user, which of the plurality of actuation devices 10 may have manipulated, how the manipulation reflects operation of the control panel, and/or to provide a response indicative of the manipulation. The computer 40 may comprise other components that those skilled in the art would recognize as being a part of a computer, such as but not limited to, memory (volatile and non-volatile) Si, a bus 52, graphics controller 53, etc. The learning network 43 may be located within the computer program instructions 47.

To minimize the control panel 20 affecting the electric field of the charged plates 26, a structure of the control panel 20 may be made of a composite and/or plastic material so as to have a non-electrical field property. More specifically, the control panel is configured to minimize the electric field that may be emitted from the structure of the control panel (excluding the actuation devices). As a non-limiting example, the control panel 20 may be made utilizing three-dimensional (3D) printing technologies, possibly resulting in the structure being made of a non-metallic alloy. In another embodiment a non-electric field emitting covering 55 (illustrated in FIG. 1) may be on, or is a part of, the back side 69 of the control panel 20. By completely eliminating or significantly reducing any electric fields attributable solely to the control panel's structure, information obtained or learned from the processor 45 may be integrated or downloaded into a processor 45 of other similar or same training and/or simulation systems, thus allowing what has been learned by the processor 45 from a prior training and/or simulation system to be applicable to other training and/or simulation systems with minimum additional training by the Bayesian network. Similarly, configuring the structure of the control panel 20 as explained above shields components internal to the structure of the control panel from external stray electric fields created by the charged plates 26.

Figure 3:
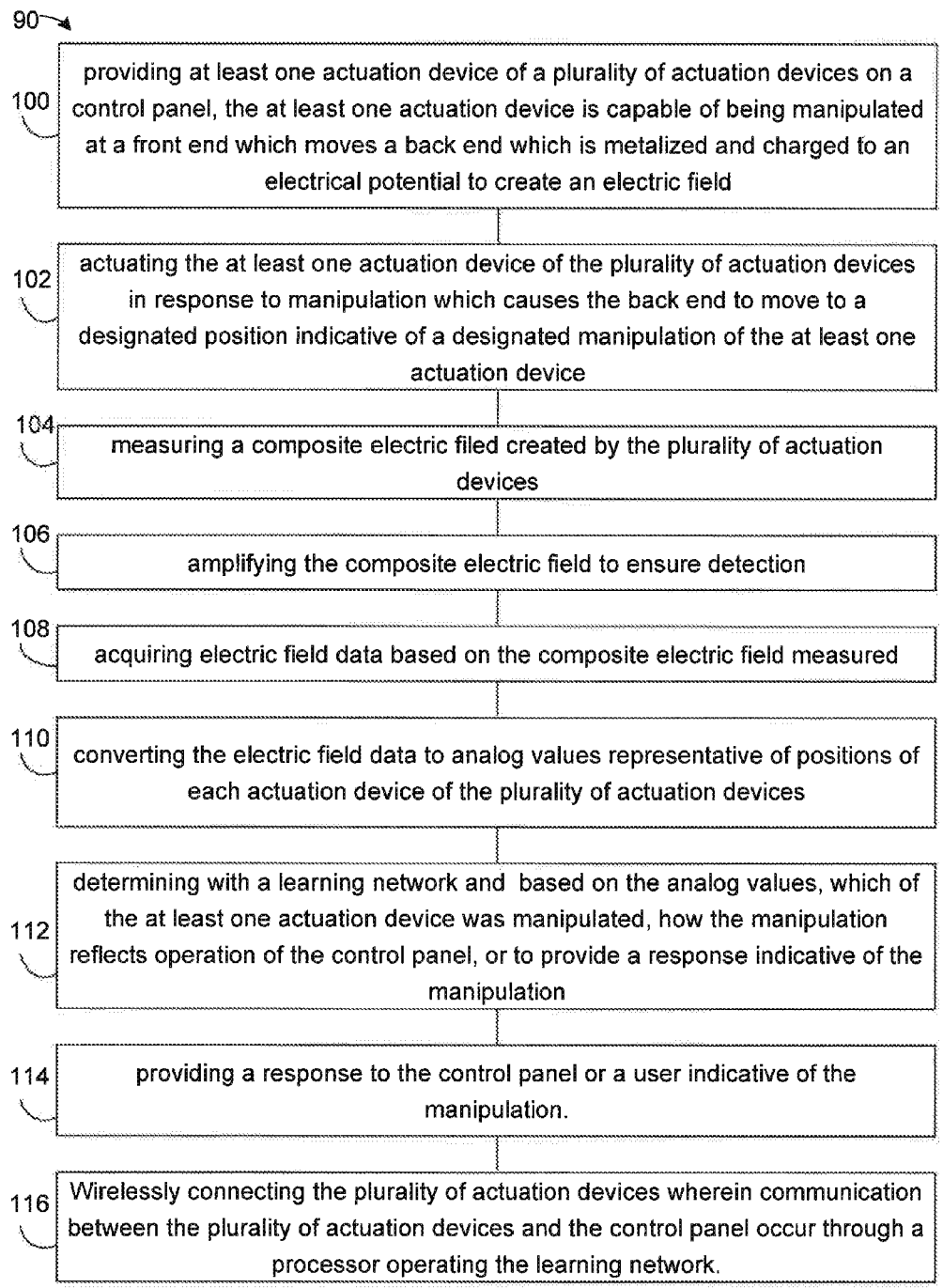
FIG. 3 shows a flowchart of a method of an embodiment.

FIG. 3 shows a flowchart of a method 90 of an embodiment. The method 90 comprises providing at least one actuation device of a plurality of actuation devices on a control panel, the at least one actuation device is capable of being manipulated at a front end which moves a back end which is metalized and charged to an electrical potential to create an electric field, at 100. The method also comprises actuating the at least one actuation device of the plurality of actuation devices in response to manipulation which causes the back end to move to a designated position indicative of a designated manipulation of the at least one actuation device, at 102. The method further comprises measuring a composite electric field created by the plurality of actuation devices, at 104, acquiring electric field data based on the composite electric field measured, at 108, and converting the electric field data to analog values representative of positions of each actuation device of the plurality of actuation devices, at 110. The method also comprises determining with a learning network and based on the analog values, which of the at least one actuation device is (and/or was) manipulated, how the manipulation reflects operation of the control panel, or to provide a response indicative of the manipulation, at 112.

The method may further comprise amplifying the electric field prior to acquiring the electric field data, at 104. The method may also comprise providing a response to the control panel and/or a user indicative of the manipulation, at 114. Additionally, acquiring the electric field data or converting the electric field data to the analog values may be performed at least as frequently as ten milliseconds. Whereas wirelessly connecting the plurality of actuation devices may comprise communications between the plurality of actuation devices and the control panel to occur through a processor operating the learning network. Finally, the step of determining, with the learning network, may further comprise determining with a probabilistic model, a trainable Bayesian network, or a classifier neural network which of the at least one actuation device was manipulated, how the manipulation reflects operation of the control panel, and/or to provide a response indicative of the manipulation.

Applying the embodiments disclosed herein would still allow for subsystems that may be tested prior to placing the subsystems in an operation system, such as but not limited to prior to finalizing integration into the operational system. As a non-limiting example, if a new avionics subsystem was developed for an aircraft, the avionics subsystem may be placed in a location reserved for the avionics subsystem on the training and/or simulation system. The avionics subsystem may function as intended within the training and/or simulation system, only the actuation devices would function using as disclosed herein where the actuation devices would communicate to the avionics subsystem by first communicating through the aggregate electric field system disclosed herein (metallic and grounded moveable part, capacitance sensor array, processor, learning network (as a non-limiting example), etc.).

Persons skilled in the art will recognize that an apparatus, such as a data processing system, including a CPU, memory, I/O, program storage, a connecting bus, and other appropriate components, could be programmed or otherwise designed to facilitate the practice of embodiments of the method. Such a system would include appropriate program means for executing the method. Also, an article of manufacture, such as a pre-recorded disk, computer readable media, or other similar computer program product, for use with a data processing system, could include a storage medium and program means recorded thereon for directing the data processing system to facilitate the practice of the method.

Embodiments may also be described in the general context of computer-executable instructions, such as program modules, being executed by any device such as, but not limited to, a computer, designed to accept data, perform prescribed mathematical and/or logical operations usually at high speed, where results of such operations may or may not be displayed. Generally, program modules include routines, programs, objects, components, data structures, etc., that perform particular tasks or implement particular abstract data types. In an embodiment, the software programs that underlie embodiments can be coded in different programming languages, for use with different devices, or platforms. It will be appreciated, however, that the principles that underlie the embodiments can be implemented with other types of computer software technologies as well.

Moreover, those skilled in the art will appreciate that the embodiments may be practiced with other computer system configurations, multiprocessor systems, microprocessor-based or programmable consumer electronics, minicomputers, mainframe computers, and the like. Embodiments may also be practiced in distributed computing environments where tasks are performed by processing devices located at different locations on board of a vehicle or stationary device, that are linked through at least one communications network. In a distributed computing environment, program modules may be located in both local and remote computer storage media including memory storage devices.

In view of the above, a non-transitory processor readable storage medium is provided. The storage medium comprises an executable computer program product which further comprises a computer software code that, when executed on a processor, causes the processor to detect, by activating a detection device, an electric field created by a plurality of actuation devices on a control panel, each actuation device is capable of being manipulated at a front end which moves a back end of the control panel, and which is metalized and charged to an electrical potential to create an electric field, from a first position to at least one other position. Also, the computer software code that, when executed on a processor, causes the processor to acquire, by activating an acquisition device, electric field data representative of the composite electric field created by the plurality of actuation devices, and convert the electric field data to analog values. Additionally, the computer software code that, when executed on a processor, causes the processor to determine, with a learning network and based on the analog values, which of the at least one activation device is (and/or was) manipulated, how the manipulation reflects operation of the control panel, or to provide a response indicative of the manipulation.

Thus, based on the embodiments disclosed herein, a system and method are provided for interrogating controls, identified as actuation devices, on a control panel as a mass operation where the need for panel wiring is reduced or eliminated. The interrogation is accomplished based on an electric field signature realized from a composite three-dimensional electric field created by the plurality of actuation devices (each actuation device comprising a metalized and grounded part), each respectively connected to a respective interrogating control. Electric field data is measured and converted into analog values that are analyzed with a processor employing a process, such as but not limited to, a probabilistic model, a Bayesian network, and/or a classifier neural network (collectively recognized herein as a learning network) to ascertain which control (or controls) is (and/or has been) manipulated.

While embodiments have been described with reference to various embodiments, it will be understood by those skilled in the art that various changes, omissions and/or additions may be made and equivalents may be substituted for elements thereof without departing from the spirit and scope of the embodiments. In addition, many modifications may be made to adapt a particular situation or material to the teachings of the embodiments without departing from the scope thereof. Therefore, it is intended that the embodiments not be limited, to the particular embodiment disclosed as the best mode contemplated, but that all embodiments falling within, the scope of the appended claims are considered. Moreover, unless specifically stated, any use of the terms first, second, etc., does not denote any order or importance, but rather the terms first, second, etc., are used to distinguish one element from another. Furthermore, the use of past or present tenses may be used interchangeably and should not be considered as limiting.

What is claimed is:

1. A system comprising:
   a plurality of actuation devices with each actuation device configured to be metalized and charged to an electrical potential rear part which moves to a designated position representative of a designated manipulation, when at least one actuation device is manipulated;
   a capacitive sensor array configured to measure a composite electric field produced by the plurality of actuation devices;
   an acquisition device configured to acquire electric field data indicative of the measured electric field;
   a converter configured to convert the acquired electric field data into analog values; and
   a processor configured to evaluate to the analog values to determine which of the at least one actuation devices was manipulated, how the manipulation reflects operation of the control panel, or to provide a response indicative of the manipulation wherein the at least one actuation device of the plurality of actuation devices is a faux actuation device which provides no wired electrical signal when manipulated and is further configured to be moved in a same manner as an actuation device which provides an electrical signal when manipulated.

2. The system according to claim 1, further comprising a control panel configured to house the plurality of actuation devices, each of the plurality of actuation devices is manipulatable from a front side of the control panel.

3. The system according to claim 2, wherein the control panel is configured to shield the components internal to the structure of the control panel from external stray electric fields.

4. The system according to claim 2, wherein the plurality of actuation devices are wirelessly connected to the control panel wherein communication between the plurality of actuation devices and the control panel occur through the processor in response to the acquired electric field data.

5. The system according to claim 1, further comprising an amplification device configured to amplify the composite electric field prior to the acquisition device acquiring the electric field data.

6. The system according to claim 1, wherein the acquisition device is configured to acquire the electric field data or determine analog values for acquired electric field data at least as frequently as ten millimeters per second.

7. The system according to claim 1, wherein a response indicative of the manipulation is communicated from the processor to the at least one of the actuation devices or to a device which notifies a user of the response.

8. The system according to claim 1, wherein the control panel is configured to minimize an electric field being emitted from a structure of the control panel.

9. The system according to claim 1, wherein the processor utilizes a learning network to analyze the analog values to determine which of the at least one faux actuation device was manipulated, how the manipulation reflects operation of the plurality of actuation devices, or to provide a response indicative of the manipulation.

10. The system according to claim 1, wherein the processor utilizes a probabilistic model, a trainable Bayesian network, or a classifier neural network to analyze the analog values to determine which one of the plurality of actuation devices was manipulated, how the manipulation reflects operation of the control panel, and/or to provide a response indicative of the manipulation.

11. The system according to claim 1, wherein the plurality of actuation devices create the composite electric field having three dimensions and the capacitive sensor array is configured to cut a two-dimensional plane through the composite electric field to measure scalar variations in the composite electric field.

12. A method comprising:
providing at least one faux actuation device of a plurality of actuation devices on a control panel, the at least one faux actuation device is capable of being selectively manipulated at a front end which moves a back end which is metalized and charged to an electrical potential to create an electric field wherein the at least one faux actuation device is configured to provide no wired electrical signal when manipulated and to be moved in a same manner as an actuation device which provides an electrical signal when manipulated;
actuating the at least one faux actuation device of the plurality of actuation devices in response to manipulation which causes the back end to move to a designated position indicative of a designated manipulation of the at least one faux actuation device;
measuring a composite electric field created by the plurality of actuation devices;
acquiring electric field data based on the composite electric field measured;
converting the electric field data to analog values representative of positions of each actuation device of the plurality of actuation devices; and
determining with a learning network and based on the analog values, which of the at least one faux actuation device was manipulated, how the manipulation reflects operation of the control panel, or to provide a response indicative of the manipulation.

13. The method according to claim 12, further comprising amplifying the composite electric field to ensure detection.

14. The method according to claim 12, further comprising providing a response to the control panel or a user indicative of the manipulation.

15. The method according to claim 12, further comprising wirelessly connecting the plurality of actuation devices wherein communication between the plurality of actuation devices and the control panel occur through a processor operating the learning network.

16. The method according to claim 12, wherein the step of determining, with the learning network, further comprises determining with a probabilistic model, a trainable Bayesian network, or classifier neural network which of the at least one faux actuation devices was manipulated, how the manipulation reflects operation of the control panel, and/or to provide a response indicative of the manipulation.

17. A non-transitory processor readable storage medium, providing an executable computer program product, the executable computer program product comprising a computer software code that, when executed on a processor, causes the processor to:
detect, by activating a detection device, an electric field created by a plurality of actuation devices on a control panel, at least one faux actuation device of the plurality of actuation devices is capable of being manipulated at a front end which moves a back end of the control panel, and which is metalized and charged to an electrical potential to create an electric field, wherein the at least one faux actuation device is configured to provide no wired electrical signal when manipulated and to be moved in a same manner as an actuation device which provides an electrical signal when manipulated;
acquire, by activating an acquisition device, electric field data representative of the composite electric field created by the plurality of actuation devices;
convert the electric field data to analog values; and
determine, with a learning network and based on the analog value, which of the at least one faux activation device was manipulated, how the manipulation reflects operation of the control panel, or to provide a response indicative of the manipulation.

18. The processor readable storage medium according to claim 17, further comprising the processor to provide a response to the control panel or a user indicative of the manipulation.

19. The processor readable storage medium according to claim 17, wherein the processor to determine, with the learning network, further comprises the processor to determine with a probabilistic model, a trainable Bayesian network, or a classifier neural network which of the at least one faux actuation device was manipulated, how the manipulation reflects operation of the control panel, and/or to provide a response indicative of the manipulation.

* * * * *